United States Patent
Maget

(10) Patent No.: US 6,864,528 B2
(45) Date of Patent: Mar. 8, 2005

(54) INTEGRATED, TUNABLE CAPACITOR

(75) Inventor: Judith Maget, Taufkirchen (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/724,905

(22) Filed: Dec. 1, 2003

(65) Prior Publication Data

US 2004/0114302 A1 Jun. 17, 2004

Related U.S. Application Data

(63) Continuation of application No. PCT/DE02/01995, filed on May 29, 2002.

(30) Foreign Application Priority Data

May 30, 2001 (DE) .......................... 101 26 328

(51) Int. Cl.$^7$ ....................... H01L 27/108; H01L 29/76; H01L 29/94; H01L 31/119; H01L 29/93
(52) U.S. Cl. ....................... 257/312; 257/598
(58) Field of Search ................ 257/295–312, 257/598

(56) References Cited

U.S. PATENT DOCUMENTS

| | | | |
|---|---|---|---|
| 4,092,619 A | * | 5/1978 | Huggins ..................... 257/312 |
| 5,965,912 A | | 10/1999 | Stolfa et al. |
| 6,100,770 A | | 8/2000 | Litwin et al. |
| 6,320,474 B1 | * | 11/2001 | Kamiya et al. ............. 257/598 |

FOREIGN PATENT DOCUMENTS

| | | |
|---|---|---|
| EP | 0 902 483 A1 | 3/1999 |
| EP | 1 024 538 A1 | 8/2000 |
| GB | 2 138 206 A | 10/1984 |
| JP | 03147376 A | 6/1991 |

OTHER PUBLICATIONS

Burghartz, J. N. et al.: "Integrated RF and Microwave Components in BiCMOS Technology", IEEE Transactions on Electron Devices, vol. 43, No. 9, Sep. 1996, pp. 1559–1570.
Maget, J. et al.: "A Varactor with High Capacitance Tuning Range in Standard 0.25um CMOS Technology", 4 pages.
Wong, W. M. Y. et al.: "A Wide Tuning Range Gated Varactor", IEEE Journal of Solid–State Circuits, vol. 35, No. 5, May 2000, pp. 773–779.
Svelto, F. et al.: "A Three Terminal Varactor for RFIC's in Standard CMOS Technology", IEEE Transactions on Electron Devices, vol. 47, No. 4, Apr. 2000, pp. 893–895.
Tiebout, M.: "A Fully Integrated 1.3GHz VCO for GSM in 0.25 $\mu$m Standard CMOS with a Phasenoise of—142Bc/Hz at 3MHz Offset", European Microwave Week, 2000, 4 pages.
Andreani, P. et al.: "On the Use of MOS Varactors in RF VCO's", IEEE Journal of Solid–State Circuits, vol. 35, No. 6, Jun. 2000, pp. 905–910.
Porret, A.-S. et al.: "Design of High–Q Varactors for Low–Power Wireless Applications Using a Standard CMOS Process", IEEE Journal of Solid–State Circuits, vol. 35, No. 3, Mar. 2000, pp. 337–345.

* cited by examiner

*Primary Examiner*—Cuong Nguyen
(74) *Attorney, Agent, or Firm*—Laurence A. Greenberg; Werner H. Stemer; Gregory L. Mayback

(57) ABSTRACT

An integrated, tunable capacitor has terminal regions that extend significantly deeper into the semiconductor body than the customary source/drain terminal regions in the conventional CMOS varactors. For this purpose, by way of example, well-type regions or collector deep implantation regions may be provided, with which the depleted regions occurring in the event of large tuning voltages extend significantly further into the semiconductor body. The varactor with a large tuning range can be produced without additional outlay in mass production methods and can be used, for example, in phase-locked loops.

7 Claims, 5 Drawing Sheets

INTEGRATED, TUNABLE CAPACITOR

CROSS-REFERENCE TO RELATED APPLICATIONS

This application is a continuation of copending International Application No. PCT/DE02/01995, filed May 29, 2002, which designated the United States and was not published in English.

BACKGROUND OF THE INVENTION

Field of the Invention

The present invention relates to an integrated, tunable capacitor.

Integrated, tunable capacitors are used in large numbers for constructing resonant circuits. Resonant circuits of this type are constructed as an LC oscillator, for example, in which the capacitor is usually formed as a frequency-detuning element. The inductors, which likewise determine the resonant circuit frequency, are usually realized in the form of coils, and normally have a constant inductance value in this case.

Voltage-controlled oscillators (VCOs) provide an output signal in the form of a frequency-adjustable high-frequency signal that can be detuned depending on a voltage present at the input. In order to obtain a large tuning range, it is necessary, on account of the usually constant inductance already mentioned, to strive to obtain a large variation ratio of the capacitance. That is to say, to obtain a large quotient of the maximum capacitance and the minimum capacitance that can be set.

Furthermore, it is desirable, for example, when the integrated, tunable capacitor is employed in a VCO, to obtain a high quality factor since the quality factor of the LC resonant circuit is incorporated quadratically into the phase noise of the circuit. In this case, the quality factor of the tunable capacitor can be determined from the series circuit of the variable capacitance C and the series resistances R that are possibly present, using the formula $Q=1/\omega RC$. Here, $\omega$ is equal to the operating frequency, R is equal to the series resistance and C is equal to the variable capacitor. Therefore, in order to obtain high quality factors, it is necessary to strive to make the series resistance as small as possible with respect to the capacitance.

Integrated, tunable capacitors can be produced in various technologies and with various constructions. The following examples are known:

Variable-capacitance diodes formed as tunable capacitors, which can be integrated either as single-ended or as differentially designed devices, cf. for example A.-S. Porret, T. Melly, C. C. Enz, E. A. Vittoz "Design of High-Q varactors for Low-Power Wireless Applications Using a Standard CMOS Process", IEEE Journal of Solid-State Circuits, Vol. 35, No. 3, March 2000, pp. 337–345.

Furthermore, the tunable capacitors may also be formed as NMOS or PMOS field-effect transistors with short-circuited source/drain regions for example in N-type wells, see for example P. Andreani, S. Mattisson, "On the Use of MOS Varactors in RF VCOs", IEEE Journal of Solid-State Circuits, Vol. 35, No. 6, June 2000, pp. 905–910.

The document by M. Tiebout, "A Fully Integrated 1.3 GHz VCO for GSM in 0.25 $\mu$m Standard CMOS with a Phasenoise of −142 dBc/Hz at 3 MHz Offset", European Microwave Week 2000, furthermore discloses a VCO with NMOS varactors.

A differentially operating PMOS-FET, an NMOS-FET in an n-type well and also an NMOS-FET in an n-type well without connected diffusion regions are disclosed in the abovementioned Porret et al. literature reference.

An NMOS field-effect transistor formed in an n-type well with p+-type extraction regions is specified in the document F. Svelto et al.: "A Three Terminal Varactor for RFIC's in Standard CMOS Technology", IEEE Transactions on Electron Devices, Volume 47, No. 4, April 2000, pages 893–895.

Finally, the paper by Wallace Ming Yip Wong et al. "A Wide Tuning Range Gated Varactor", IEEE Journal of Solid-State Circuits, Vol. 35, No. 5, May 2000, pp. 773–779 specifies a so-called gated varactor.

Of the previous solutions mentioned for providing a tunable capacitor, those components embodied as a gated varactor and as an NMOS field-effect transistor, formed in an n-type well with p+-type extraction regions, are those with the largest possible tuning range. In this case, the high-frequency signal is usually applied to the gate terminal, a second terminal is used for feeding the tuning voltage, and, depending on the embodiment, a third terminal is used for applying a further voltage for increasing the tuning range.

The total effective capacitance of a component of this type depends on its respective operating state, such as inversion, depletion, accumulation, or enhancement, and is determined by the voltages at the nodes mentioned. In this case, the generally constant parasitic capacitances of a device of this type generally always have an additive influence.

In inversion, as well as in accumulation, the maximum capacitance that can be obtained results as the sum of the gate oxide capacitance, determined by the gate area and the thickness of the gate oxide layer, and from the constant parasitic capacitances between the gate and the source/drain regions. By contrast, the minimum capacitance that can be obtained results, in depletion, as a series circuit of the gate oxide capacitance and the depletion capacitance and, in parallel therewith, the constant parasitic capacitances between the gate and the source/drain regions. For a given gate area and a given technology which determines the gate oxide layer thickness, the tuning range can consequently be increased only by reducing the minimum capacitance and/or the constant capacitances.

When the tunable capacitor is used, for example, in an LC-VCO, in order to obtain an acceptable phase noise of the VCO, it is desirable to keep down series resistances, as explained above, in the LC circuit as well.

For this purpose, as is customary in the case of high-frequency transistors, use is made of so-called finger structures and also transistors having a short gate length. By contrast, the parasitic capacitances are largely independent of the gate length. Only the variable part of the capacitances decrease with the gate length. The smaller the gate length, therefore, the larger the parasitic capacitances are in comparison with the variable capacitances. Therefore, in order to obtain higher quality factors, it has been necessary hitherto to accept obtaining a smaller tuning range. The converse statement also holds true: the larger the gate length, the lower the significance of the parasitic capacitances and, accordingly, a larger tuning range can be obtained. However, a larger gate length leads to increasing series resistances and thus to a poorer quality factor.

SUMMARY OF THE INVENTION

It is accordingly an object of the invention to provide an integrated, tunable capacitor which overcomes the above-mentioned disadvantages of the prior art apparatus of this general type.

In particular, it is an object of the present invention to provide an integrated, tunable capacitor that can be produced in standard fabrication processes and that has an increased tuning range.

With the foregoing and other objects in view there is provided, in accordance with the invention, an embodiment of an integrated, tunable capacitor including: a semiconductor body including a semiconductor region of a first conductivity type; a first insulating region adjoining the semiconductor region of the first conductivity type; and a control electrode for applying a control voltage. The control electrode is configured on the first insulating region. The tunable capacitor includes a first region of a second conductivity type. The first region is introduced into the semiconductor body. The first region adjoins the semiconductor region. The first region includes a highly doped region of the second conductivity type. The highly doped region of the second conductivity type is highly doped with respect to the first region. The highly doped region of the second conductivity type is for obtaining a tuning voltage. The tunable capacitor also includes a well region of the second conductivity type. The well region is configured in the first region of the second conductivity type. The well region is configured below the highly doped region of the second conductivity type. The highly doped region of the second conductivity type is embodied as a terminal region.

With the foregoing and other objects in view there is also provided, in accordance with the invention, another embodiment of an integrated, tunable capacitor including: a semiconductor body including a semiconductor region of a first conductivity type; a first insulating region adjoining the semiconductor region of the first conductivity type; and a control electrode for applying a control voltage. The control electrode is configured on the first insulating region. The tunable capacitor includes a first region of a second conductivity type. The first region is introduced into the semiconductor body. The first region adjoins the semiconductor region. The first region includes a highly doped region of the second conductivity type. The highly doped region of the second conductivity type is highly doped with respect to the first region. The highly doped region of the second conductivity type is for obtaining a tuning voltage. This embodiment of the tunable capacitor also includes a buried layer formed completely as a highly doped region. The buried layer adjoins the first region of the second conductivity type.

The described space charge zone with the maximum depth is accordingly established when the control voltage is varied in a maximum permissible range at the control electrode below the latter, more precisely below the first insulating region, if the first region of the second conductivity type were not present.

As an alternative or in addition, the layer thickness of the first region of the second conductivity type is greater than the extent of the space charge zone that is established around the first region when a maximum tuning voltage that can be set is applied.

The layer thickness of the first region of the second conductivity type is understood to be the extent of the region in an orthogonal direction with respect to the active front side of the semiconductor body.

The semiconductor body may be at a fixed potential, for example, reference-ground potential.

The control voltage is understood to be the voltage that is dropped between the control electrode and the semiconductor body.

The tuning voltage is understood to be the voltage which is dropped between the first region of the second conductivity type and the semiconductor body. The tuning voltage and the control voltage influence the capacitance of the varactor.

Depending on a voltage applied between the control electrode and the first region of the second conductivity type, a space charge zone forms below the gate electrode and brings about a voltage-dependent capacitance change in the present tunable capacitor. The invention is based on the insight that with an increasing depth, that is to say, an increasing layer thickness of the first region of the second conductivity type, which is provided for applying the tuning voltage, the space charge zone extends further into the depth of the semiconductor body in a voltage-dependent manner, as a result of which, the minimum capacitance is reduced. It is thus possible to obtain a larger tuning range, that is to say a larger variation ratio of the maximum to minimum capacitance that can be set. In this case, the semiconductor region below the control electrode is of a low dopant concentration, that is to say it is weakly doped.

The present integrated, tunable capacitor is based on an NMOS field-effect transistor and may be interpreted such that the source/drain regions usually provided, which are short-circuited with one another in order to form a varactor, have a significantly increased layer thickness with respect to the customary source/drain regions in standard CMOS fabrication processes.

For this purpose, by way of example, either a well-type region may underlie the first region of the second conductivity type, or it is possible to provide, instead of a source/drain region produced using CMOS technology, for example, a collector deep implantation region produced using bipolar fabrication technology, as will be explained in more detail later.

The regions of the second conductivity type extending into larger depths in the semiconductor body have the effect, given suitable dimensioning and a suitable distance, besides the deeper extent of the associated space charge zones upon the application of a tuning voltage, additionally that the region below the first insulating region in the semiconductor region can be completely depleted of mobile charge carriers. As the applied tuning voltage increases, the space charge capacitance of the present subject matter is greatly reduced in comparison with the conventional varactors, so that the minimum total capacitance that can be set decreases greatly. This means that the variation ratio or the tuning range is significantly improved. The maximum capacitance that can be set can be achieved, in inversion, by virtue of the fact that, depending on the voltage present, the space charge zones become smaller and smaller, so that the space charge capacitance becomes larger and larger and tends toward infinity. The total capacitance then results as the capacitance of the first insulating region, which, with regard to the total capacitance of the varactor, is connected in series with the voltage-dependent space charge zone capacitance. Connected in parallel with this series circuit including the gate oxide capacitance and the space charge zone capacitance are further parasitic capacitances which may result from edge effects and overlaps.

Since only the at least one, first region of the second conductivity type is to be provided with a larger depth with respect to conventional NMOS varactors, it is possible to produce the described varactor with a large tuning range in a simple manner in standard production methods.

In an advantageous embodiment of the present invention, a second region of the second conductivity type is provided, which is arranged symmetrically with respect to the first region of the second conductivity type, has a highly doped region for feeding the control voltage and has the layer thickness of the first region of the second conductivity type.

With respect to an axis of symmetry through the control electrode and the first insulating region, the second region of the second conductivity type is arranged axially symmetrically with respect to the first region of the second conductivity type. Terminals for feeding the control voltage of the first and the second regions of the second conductivity type are to be short-circuited for operating an arrangement of this type as a varactor in external circuitry. The further terminal of the tunable capacitor is the control electrode.

Depending on the tuning voltage, space charge zones in each case form around both regions of the second conductivity type and merge in order to obtain a large variation ratio below the control electrode at the maximum extent. For this purpose, the distance between the regions of the second conductivity type is also to be set in a suitable manner depending on the doping ratios and the maximum permissible voltage range.

In a further preferred embodiment of the present invention, a second insulating region is introduced in the semiconductor body between the first region of the second conductivity type and the semiconductor region below the control electrode.

The second insulating region may be formed, for example, as a so-called thick oxide region with a larger layer thickness with respect to the first insulating layer below the control electrode and can be embodied, for example, in the form of a so-called shallow trench isolation region (STI). Inserting such an insulating region into the semiconductor body increases the tuning range even further, since the parasitic overlap and fringing capacitances are reduced.

In a further preferred embodiment of the present invention, the layer thickness of the first region of the second conductivity type is significantly greater than the layer thickness of the second insulating region.

The larger layer thickness of the first region of the second conductivity type with respect to the second insulating region enables a lateral extent, for example, when the first region of the second conductivity type is embodied as a collector deep implantation region, to take place along and below the second insulating region. This reduces the series resistance of the tunable capacitor, which in turn improves the quality factor of the tunable capacitor.

It goes without saying that in the case of the described symmetrical embodiment of the capacitor with two regions of the second conductivity type, it is possible correspondingly to provide a further, second insulating region into the semiconductor body likewise symmetrically with respect to an axis through the control electrode and perpendicularly to the active front side of the semiconductor body.

While a described lateral extent of the regions of the second conductivity type below the second insulating regions is desirable, care must be taken to ensure, however, that this does not extend beyond the second insulating regions into the semiconductor region below the control electrode.

In a further preferred embodiment of the present invention, the first region of the second conductivity type is formed completely as a highly doped region.

Besides the advantages already described with regard to the tuning range by virtue of the deeper space charge zones, forming the first region of the second conductivity type completely as a highly doped region makes it possible to further reduce the series resistance of the varactor and thus to improve the quality factor even further.

In a further preferred embodiment of the present invention, the first region of the second conductivity type is formed as a collector deep implantation region using a bipolar fabrication technology.

In BiCMOS fabrication processes, for example, a collector deep implantation region of this type can be produced in a simple manner. Accordingly, a varactor of this type can be produced with comparatively low outlay in mass production methods in conjunction with a large tuning range and a high quality factor.

In a further preferred embodiment of the present invention, a buried layer is provided, which adjoins the first region of the second conductivity type.

The buried layer preferably runs below the semiconductor region which is arranged below the first insulating region and runs parallel thereto and also parallel to the active front side of the semiconductor body. The buried layer enables the series resistance to be reduced even further.

In a further preferred embodiment of the present invention, the first region of the second conductivity type has a well-type region of the second conductivity type, which adjoins a highly doped terminal region of the second conductivity type.

Instead of the collector deep implantation regions described, the region or regions. of the second conductivity type may also be formed as well-type regions that in each case adjoin a highly doped terminal region of the same conductivity type. In this case, the well-type region extends to a significantly greater depth into the semiconductor body, orthogonally with respect to the active front side thereof and, as viewed from the active front side, than the highly doped terminal region itself, which may be formed as a source/drain terminal region, for example, in a CMOS fabrication step.

The formation of comparatively lightly doped wells can also be implemented in the standard CMOS semiconductor processes without an additional outlay in conjunction with a significant improvement in the tuning range of the varactor.

In a further preferred embodiment of the present invention, a region for connecting to a reference-ground potential is provided, which is of the first conductivity type, which is also highly doped, and which is introduced into the semiconductor region.

The region for connection to reference-ground potential is preferably arranged along the active front side of the semiconductor region and preferably has common interfaces with the first insulating region and, if appropriate, with the second insulating region.

This direct linking to a reference-ground potential or substrate terminal may improve the quality factor of the arrangement even further.

In a further advantageous embodiment of the present invention, the first region of the second conductivity type in each case has a common interface with the first insulating region and with the semiconductor region below the control electrode.

With such a direct linking of the first insulating region to a region of the second conductivity type for feeding the tuning voltage at comparatively few locations in the semiconductor, it is possible to attain a further improvement in the quality factor. Moreover, it is ensured that the maximum capacitance of the arrangement can be achieved through inversion of the region below the control electrode.

The tunable capacitor described is preferably formed in a so-called finger structure—known from high-frequency transistors—with a plurality of control electrodes or gate tracks running in parallel. Both the last-mentioned direct linking and the linking to reference-ground potential with a region of the first conductivity type take up only a comparatively small proportion of area relative to the total chip area taken up by the tunable capacitor.

Other features which are considered as characteristic for the invention are set forth in the appended claims.

Although the invention is illustrated and described herein as embodied in an integrated, tunable capacitor, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
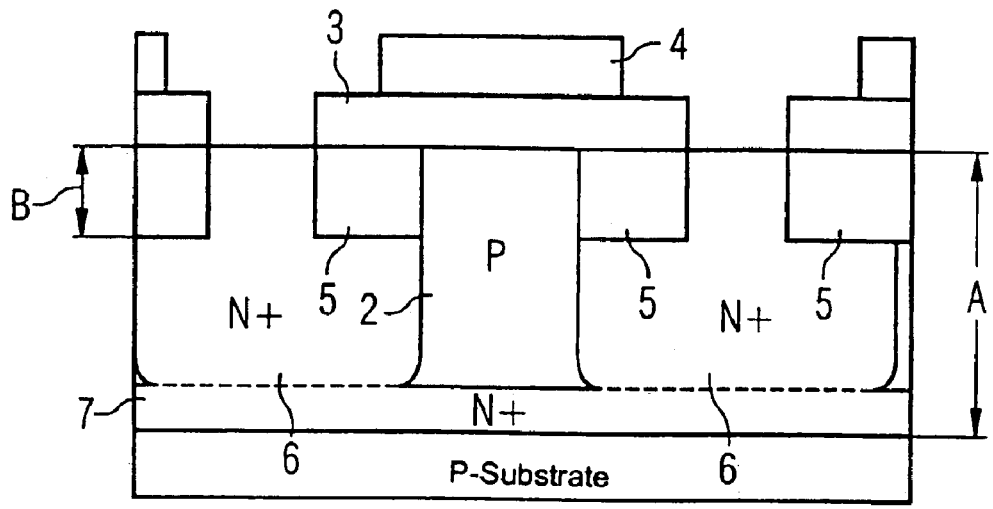
FIG. 1 is a cross sectional view of a first exemplary embodiment of an integrated, tunable capacitor constructed in BiCMOS fabrication technology.

Referring now to the figures of the drawing in detail and first, particularly, to FIG. 1 thereof, there is shown a simplified cross section through a first exemplary embodiment of an inventive tunable and integrated capacitor. In this case, a semiconductor body 1 is provided, which has a P-type substrate with a semiconductor region 2, which is likewise lightly P-doped. A gate oxide layer is applied above the semiconductor region 2 as a first insulating layer 3. A gate electrode 4, formed as a polycrystalline layer, is arranged on the gate oxide layer. A second insulating layer 5, formed as a thick oxide region with a layer thickness B, is in each case introduced into the semiconductor body 1 adjacent to the semiconductor region 2. These second insulating layers 5 in each case have a common interface with the first insulating region 3. The boundaries of the second insulating layers 5 terminate flush at a respective side, and also with the semiconductor region 2 below the gate electrode 4. Adjacent the first insulating regions 3 and in each case opposite the semiconductor region 2, a region 6 of a second conductivity type N, formed as a highly doped N+-type collector deep implantation region, is in each case introduced in the semiconductor body 1, with a layer thickness A. In this case, the layer thickness A of the collector deep implantation regions 6 is significantly greater than the layer thickness B of the thick oxide regions 5, in each case measured perpendicular to the active front side of the semiconductor body 1. On account of lateral diffusion, for example, the collector deep implantation region 6 in each case extends below the first insulating region 3 and is thus directly adjacent the semiconductor region 2 below the gate electrode 4. The N+-type collector deep implantation regions 6 are furthermore bounded by the active front side of the semiconductor body 1 and also by a buried layer 7, which runs parallel to the first insulating region 3 and parallel to the active front side of the semiconductor body 1 and adjoins the collector deep implantation regions 6. The buried layer 7 is likewise of the second conductivity type N and also highly doped N+.

In the case of the present subject matter in accordance with FIG. 1, it is possible to feed a tuning voltage between the terminals to be short-circuited at the collector deep implantation regions 6 and the semiconductor body 1. As the tuning voltage increases, space charge zones in each case form around the collector deep implantation regions 6. These space charge zones are significantly enlarged with respect to conventional varactors, as a result of which the minimum varactor capacitance that can be set decreases and the tuning range is thus increased.

Figure 2:
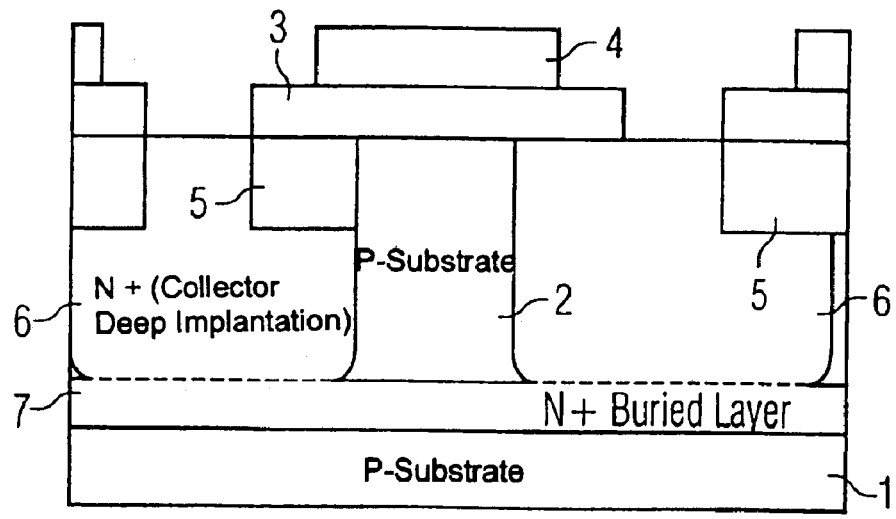
FIG. 2 is a cross sectional view of another exemplary embodiment of an integrated, tunable capacitor constructed in BiCMOS fabrication technology.

FIG. 2 is a cross section of a further exemplary embodiment of the present invention based on the arrangement of FIG. 1, but with a direct linking of the N+-type collector deep implantation region 6 to the first insulating region 3. The remaining features of the arrangement correspond in terms of arrangement and function to those already explained in FIG. 1.

This direct linking of the collector deep implantation region 6 to the insulating layer 3 by omitting one of the second insulating regions 5 makes it possible to improve the quality factor of the varactor. In order to obtain the high tuning range of the varactor, however, the invention has the cross section in shown in FIG. 2 only at comparatively few locations in the semiconductor, since parasitic overlap and fringing capacitances remain low.

Figure 3:
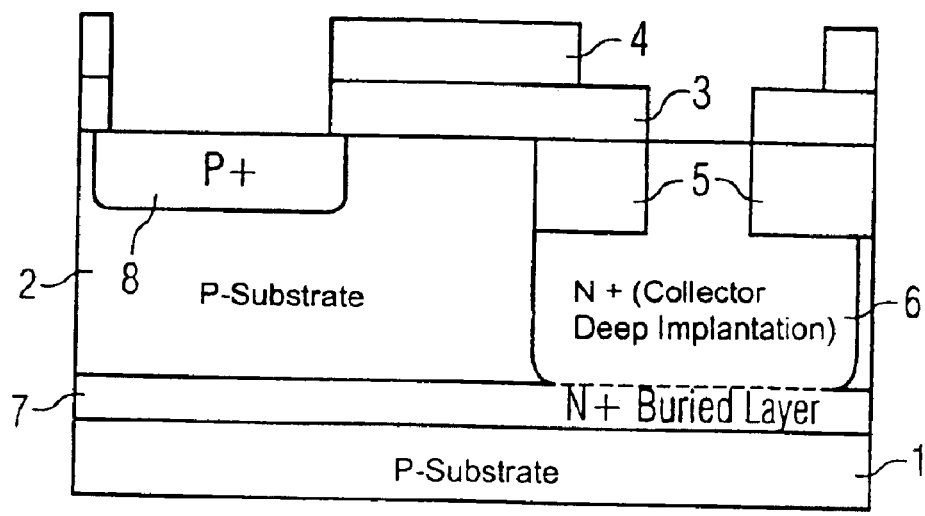
FIG. 3 is a cross sectional view of another exemplary embodiment of an integrated, tunable capacitor constructed in BiCMOS fabrication technology.

FIG. 3 shows an even further development of a tunable capacitor constructed in accordance with FIG. 1, but with a direct connection to a reference-ground potential terminal region 8. In accordance with FIG. 3, the reference-ground potential terminal region 8, at a small number of locations, replaces the collector deep implantation region 6 and also one of the thick oxide regions 5. The reference-ground potential terminal region 8 adjoins the active front side of the semiconductor body 1 and additionally has a common interface with the semiconductor region 2 below the gate electrode 4 and also with the gate oxide layer 3. Like the direct linking of the collector deep implantation region 6 to the gate oxide 3 in accordance with FIG. 2, the reference-ground potential terminal region 8 constructed in accordance with FIG. 3 is also provided only at few locations in the semiconductor. The reference-ground potential terminal region 8 in accordance with FIG. 3 enables a further improvement in the quality factor of the varactor.

Figure 4:
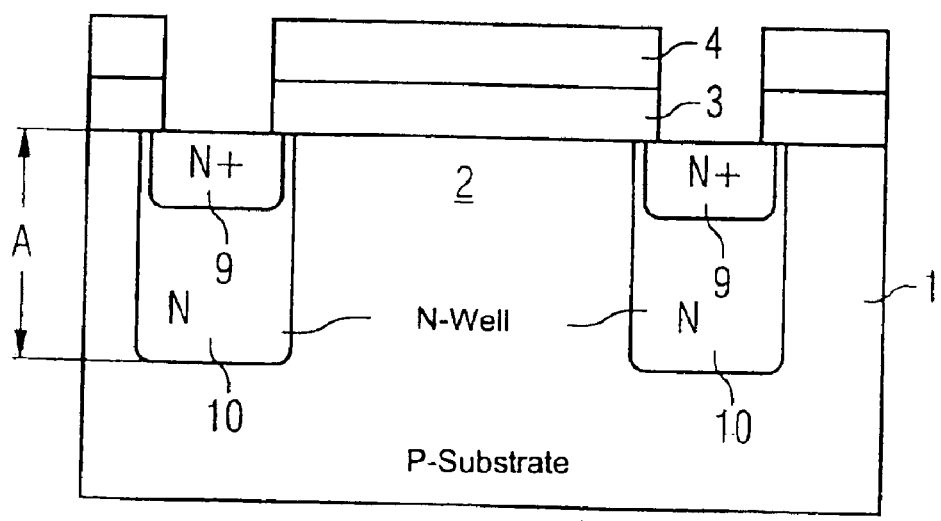
FIG. 4 is a cross sectional view of another exemplary embodiment of an integrated, tunable capacitor constructed in CMOS fabrication technology.

While the exemplary embodiments constructed in accordance with FIGS. 1 to 3 are produced using a BiCMOS fabrication technology, the exemplary embodiment constructed in accordance with FIG. 4, which the latter shows using a simplified cross section, can be produced in a conventional CMOS fabrication process. The exemplary embodiment in accordance with FIG. 4 shows a semiconductor body 1 with a P-type substrate. The active front side of the semiconductor body 1 is provided with a first insulating layer 3 and a gate electrode 4 configured above the first insulating layer 3. The weakly doped P-type substrate region is provided as a semiconductor region 2 below the gate electrode 4. Accordingly, no additional, doped region is introduced into the P-type substrate 1 below the gate terminal 4. Adjoining the first insulating layer 3, the gate oxide layer, and adjacent the semiconductor region 2, N+-type terminal regions 9 are in each case introduced into the semiconductor body 1, as are usually provided as source/drain and well terminal regions in CMOS technology. Compared with the source/drain regions of a CMOS transistor, however, the present arrangement differs by virtue of the fact that the N+-type terminal regions 9 are in each case adjoined by an N-type well 10 having a significantly greater layer thickness A than the terminal regions 9. These N-type wells are doped more lightly than the N+-type terminal regions 9 and are provided with reference symbol 10. The N-type wells 10 have a layer thickness A which is significantly greater than the layer thickness of the N+-type terminal regions 9, in each case measured orthogonally with respect to the front side of the semiconductor body 1 and proceeding from the front side. The N-type wells 10 may surround the N+-type terminal regions 9 not only into the depth into the semiconductor body 1, but also in the lateral direction.

Depending on the applied tuning voltage between the semiconductor body 1 and the N+-type terminal regions 9, which are externally short-circuited with one another, space charge zones in each case form around the N-type well regions 10. These space charge zones, compared with conventional CMOS varactors, reach a significantly greater depth into the semiconductor body, which are calculated from the sum A+D of the depth A of the N-type wells 10 themselves and the extent D of the space charge zone below the N-type wells 10, and additionally touch one another depending on the applied voltage, so that overall a significant improvement in the variation ratio is obtained with a low outlay, since the minimum capacitance that can be set is lower.

Figure 5:
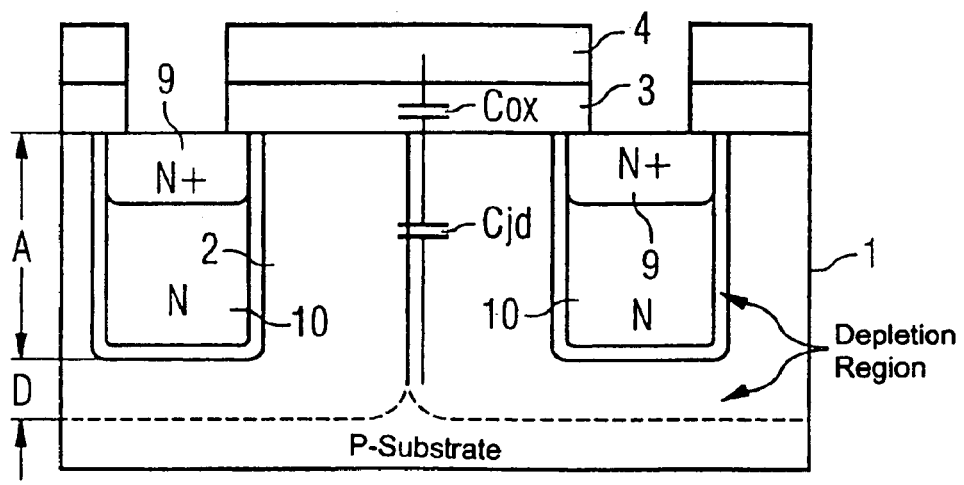
FIG. 5 is a cross sectional view of the exemplary embodiment shown in FIG. 4 under conditions in which a maximum space charge zone is at the regions of the second conductivity type.

FIG. 5 elucidates the conditions when the space charge zones of the N-type wells 10 touch, thus giving rise to a very deep depleted region below the gate electrode 4. For this purpose, FIG. 5 is supplemented with respect to FIG. 4 to the effect that the illustration depicts first the constant gate oxide capacitance $C_{ox}$ and, in series with the constant gate oxide capacitance $C_{ox}$, the variable space charge capacitance $C_{jd}$. On account of these comparatively deeply extending depleted regions around the N-type wells 10, which regions touch one another, the region 2 below the gate oxide 3, at least as far as the depth A of the N-type wells 10, is completely depleted of mobile charge carriers and the space charge capacitance $C_{jd}$ is thereby greatly reduced in comparison with conventional varactors. The minimum total capacitance that can be set decreases significantly as a result of this, as a result of which, the tuning range is also significantly increased. The varactor is to be dimensioned in such a way that the depth A of the N-type wells 10 is significantly greater than the maximum depth D of the space charge zone around the N-type wells 10 and/or significantly greater than the maximum depth X of the space charge zone below the gate oxide region 3, which would be established if no regions of the second conductivity type 9, 10 were present. The distance between the two N-type wells 10 is preferably less than or equal to twice the extent D of the space charge zones around the N-type wells in order to ensure that the two space charge zones around the N-type wells 10 touch one another in the event of depletion.

In this case, the total capacitance is calculated in accordance with the series circuit including the gate oxide capacitance and the space charge capacitance from the reciprocal of the sum of the reciprocal capacitance values $C_{ox}$, $C_{jd}$ of the series circuit.

Figure 6:
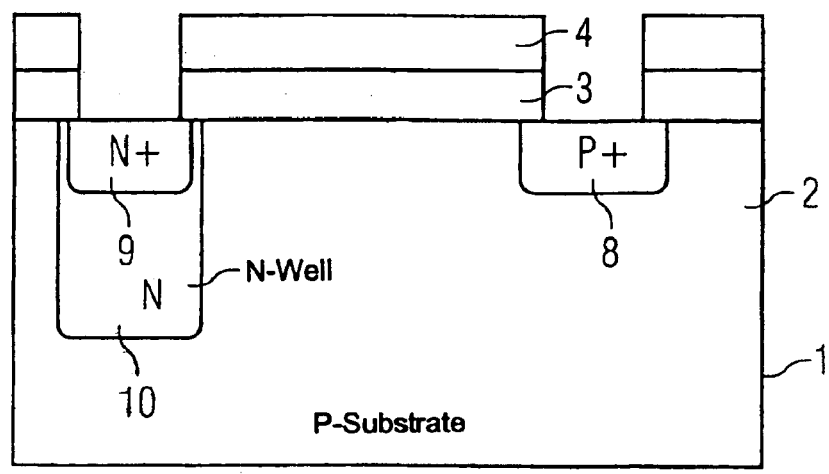
FIG. 6 is a cross sectional view of the exemplary embodiment shown in FIG. 4, but with a connection to reference-ground potential.

FIG. 6 shows a development of the embodiment of the invention constructed in accordance with FIG. 4, but with a reference-ground potential terminal region 8, which is introduced into the semiconductor body 1. The reference-ground potential terminal region 8 adjoins the active front side of the semiconductor body 1 and adjoins the gate oxide 3. The semiconductor region 2, which is lightly P-doped, is thus bounded toward the top by the gate oxide region 3 and laterally on the one hand by the N-type well 10 and on the other hand by the P+-type reference-ground potential terminal region 8. The P+-type reference-ground potential terminal region 8 is only provided at a small number of locations of the varactor, which is preferably formed in a finger structure and is accordingly formed predominantly with a cross section in accordance with FIG. 4. The P+-type reference-ground potential terminal region 8 shown enables the quality factor of the varactor to be improved even further.

Figure 7:
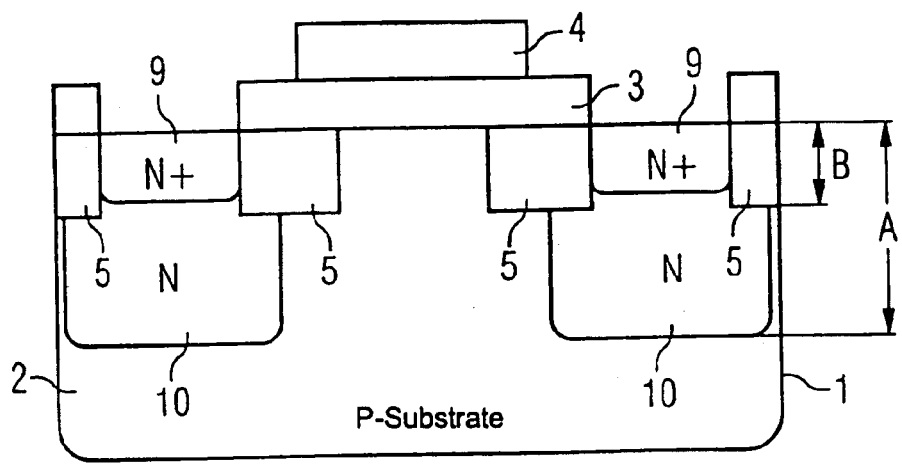
FIG. 7 is a cross sectional view of the exemplary embodiment shown in FIG. 4, but with a STI.

FIG. 7 shows a development of a varactor in accordance with FIG. 4, in which, in addition to the described improvement of the variation ratio by using deep N-type wells 10, an even further improvement in the variation ratio or the tuning range is obtained by virtue of the fact that thick oxide regions 5 formed as a shallow trench isolation (STI) are introduced into the semiconductor body 1 in a manner adjoining the active front side thereof. The thick oxide regions 5 in each case have a common interface with the gate oxide 3 and thus laterally bound the region 2 below the gate electrode 4. Furthermore, the thick oxide regions 5 laterally adjoin the N+-type terminal regions 9 of the varactor, which are formed as source/drain regions, but under which lie the N-type wells 10 already described in FIG. 4. The region 2 below the gate 4 is once again formed as a lightly doped P-type substrate. The N-type wells 10 are dimensioned in such a way that their layer thickness A is significantly greater than the layer thickness B of the thick oxide regions 5. With the thick oxide regions 5, the overlap and fringing capacitances occurring in the case of FIG. 4, which act in parallel with the series circuit including space charge capacitance and gate oxide capacitance, are reduced further and the variation ratio is thus improved further.

Figure 8:
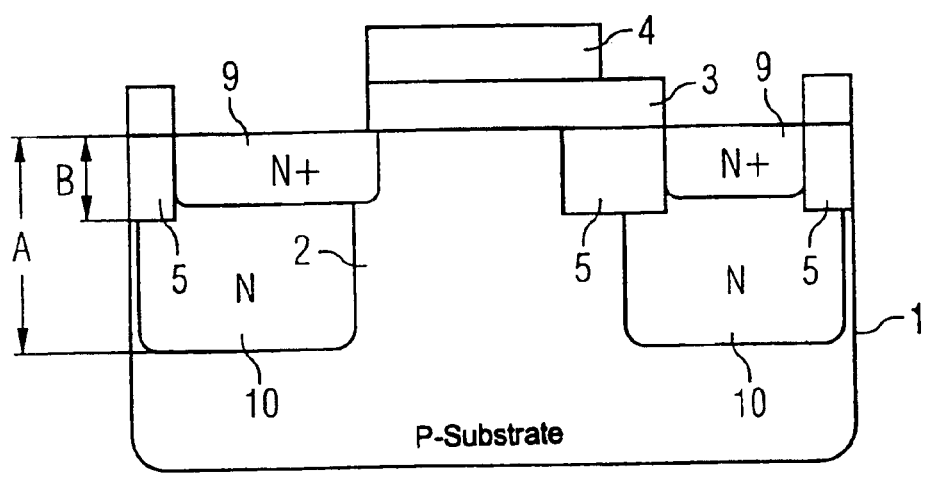
FIG. 8 is a cross sectional view of the exemplary embodiment shown in FIG. 7, but with a source/drain region directly connected to a gate oxide.

FIG. 8 shows a cross section through an embodiment that is constructed as in FIG. 7, but with an improvement in the quality factor by virtue of the fact that, at a small number of locations in the semiconductor, an N-type well 10 or advantageously an N+-type terminal region 9 is directly linked to the gate oxide region 3 and also to the semiconductor region 2 below the gate electrode. For this purpose, at a small number of locations, an STI 5 constructed in accordance with FIG. 7 is obviated and is replaced by the N+-type region 9 or by the N-type well 10, which is enlarged in the direction of the semiconductor region 2 below the control electrode 4 and adjoins the control electrode 4 and the gate oxide region 3.

Figure 9:
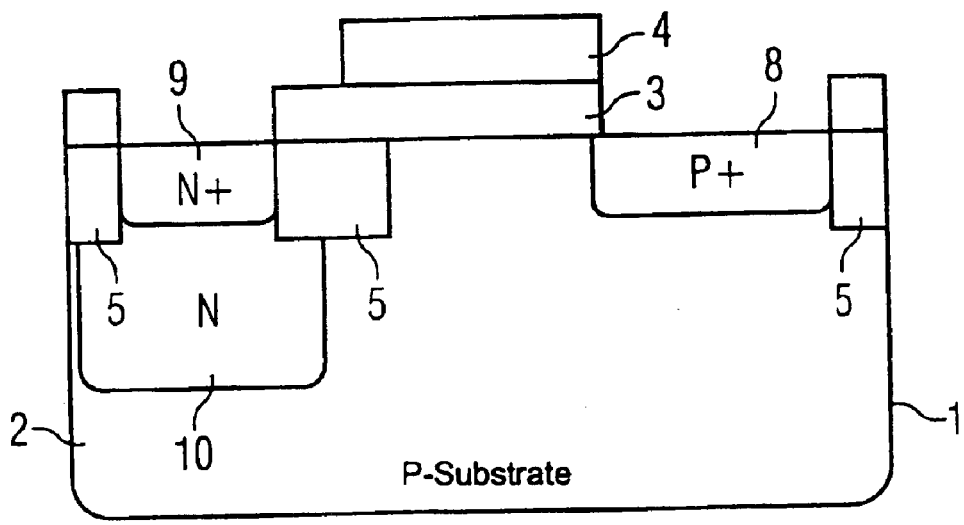
FIG. 9 is a cross sectional view of the exemplary embodiment shown in FIG. 7, but with a direct connection to a reference-ground potential.

FIG. 9 shows a development of the embodiment shown in FIG. 7, but with a direct link—as already explained several times—of the gate oxide region 3 and of the region 2 below the control electrode 4 to a p-type terminal region 8, which is introduced into the semiconductor body 1 at the active front side thereof and which adjoins the gate oxide region 3. As already described above, the regions of direct connection to gate oxide 3 and the semiconductor region 2 in accordance with FIGS. 8 and 9 are provided only at a small number of locations in the semiconductor for reasons of maintaining the good tuning range, so that a varactor formed in a finger structure, for example, in accordance with FIGS. 7 to 9 has a cross section in accordance with FIG. 7 in the predominant proportion of the cross sections. The regions of direct connection in accordance with FIG. 8 lead to a further improved quality factor. The regions of direct connection in accordance with FIG. 9 may contribute to an even further improved quality factor.

Figure 10:
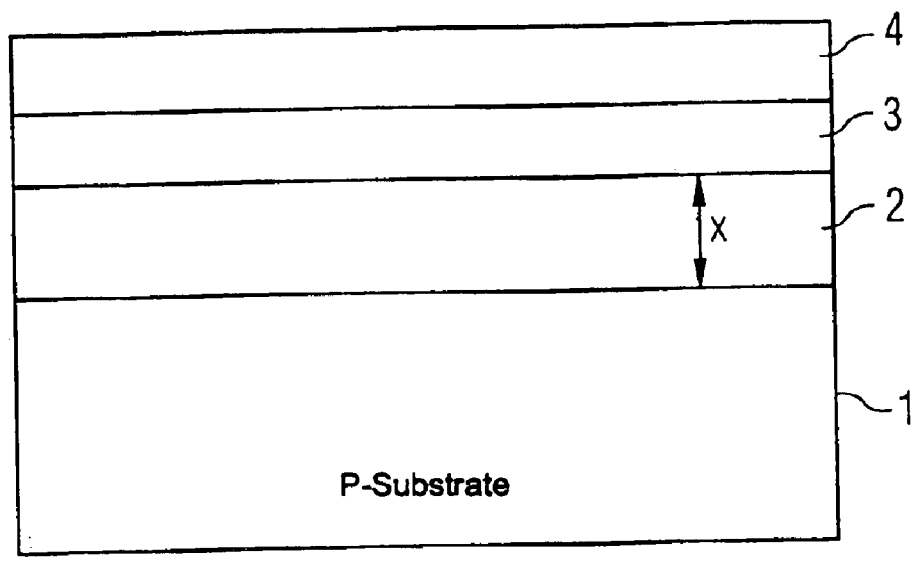
FIG. 10 is a cross sectional view of a configuration constructed without regions of the second conductivity type, which configuration is provided for explaining the formation of a space charge zone.

FIG. 10 shows a semiconductor body 1 formed as a P-type substrate, with a semiconductor region 2 on which a gate oxide layer 3 is applied. A control electrode 4 is arranged above the gate oxide layer 3. When a control voltage, which can be applied to the control electrode 4, is varied within permissible limits, a space charge zone is established in the semiconductor region 2 below the gate. The space charge zone has a maximum extent X in a direction perpendicular to a front side of the semiconductor body. In accordance with the principle described, the depth A of the regions of the second conductivity type, which regions are not present in FIG. 10, is intended to be greater than the maximum extent X.

Instead of the described embodiment with a P-type substrate, the principle of the invention may, of course, also be applied to fabrication processes in which an N-type substrate is used. In this case, all further regions mentioned in the exemplary embodiments are to be formed with the opposite conductivity type, whereas the dopant concentrations may largely be maintained.

I claim:

1. An integrated, tunable capacitor, comprising:
   a semiconductor body including a semiconductor region of a first conductivity type;
   a first insulating region adjoining said semiconductor region of said first conductivity type;
   a control electrode for applying a control voltage, said, control electrode configured on said first insulating region;
   a first region of a second conductivity type, said first region introduced into said semiconductor body, said first region adjoining said semiconductor region, said first region including a highly doped region of said second conductivity type, said highly doped region of said second conductivity type being highly doped with respect to said first region, said highly doped region of said second conductivity type for obtaining a tuning voltage; and
   a well region of said second conductivity type, said well region configured in said first region of said second conductivity type, said well region configured below said highly doped region of said second conductivity type;
   said highly doped region of said second conductivity type embodied as a terminal region.

2. The capacitor according to claim 1, further comprising:
   a second region of said second conductivity type;
   said second region of said second conductivity type configured symmetrically with respect to said first region;
   said second region of said second conductivity type including a highly doped region for obtaining a control voltage;
   said highly doped region of said second region being highly doped with respect to other regions of said second region;
   said first region having a layer thickness; and
   said second region of said second conductivity type having a layer thickness equal to said layer thickness of said first region.

3. The capacitor according to claim 1, further comprising:
   a second insulating region introduced into said semiconductor body between said first region and portions of said
   semiconductor region of said first conductivity type configured below said control electrode.

4. The capacitor according to claim 3, wherein:
   said second insulating region has a layer thickness; and
   said first region of said second conductivity type has a layer thickness that is greater than said layer thickness of said second insulating region.

5. The capacitor according to claim 1, further comprising:
   a region for connecting to a reference-ground potential;
   said region for connecting to the reference-ground potential being of said first conductivity type and being highly doped;
   said region for connecting to the reference-ground potential introduced into said semiconductor body;
   said region for connecting to the reference-ground potential adjoining said semiconductor region below said control electrode.

6. The capacitor according to claim 1, wherein:
   said first region has a common interface with said first insulating region and said semiconductor region below said control electrode.

7. The capacitor according to claim 1, wherein:
   said first region has a layer thickness that is greater than a maximum depth of a space charge zone that would be established by applying variable control voltage to another structure including:
   a semiconductor body having a semiconductor region of said first conductivity type, a first insulating region adjoining said semiconductor region, and a control electrode configured on said first insulating region, said control electrode being supplied with the variable control voltage.

* * * * *